(12) United States Patent
Romanescu et al.

(10) Patent No.: US 9,960,284 B2
(45) Date of Patent: May 1, 2018

(54) SEMICONDUCTOR STRUCTURE INCLUDING A VARACTOR

(71) Applicant: GLOBALFOUNDRIES Inc., Grand Cayman (KY)

(72) Inventors: Alexandru Romanescu, Dresden (DE); Christian Schippel, Dresden (DE); Nicolas Sassiat, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 14/928,595

(22) Filed: Oct. 30, 2015

(65) Prior Publication Data

US 2017/0125610 A1    May 4, 2017

(51) Int. Cl.
| | |
|---|---|
| *H01L 29/93* | (2006.01) |
| *H01L 29/10* | (2006.01) |
| *H01L 29/16* | (2006.01) |
| *H01L 29/49* | (2006.01) |
| *H01L 29/66* | (2006.01) |
| *H01L 27/06* | (2006.01) |
| *H01L 29/161* | (2006.01) |

(52) U.S. Cl.
CPC .......... *H01L 29/93* (2013.01); *H01L 27/0629* (2013.01); *H01L 29/1095* (2013.01); *H01L 29/161* (2013.01); *H01L 29/4966* (2013.01); *H01L 29/66174* (2013.01); *H01L 29/66537* (2013.01)

(58) Field of Classification Search
CPC ... H01L 29/93; H01L 29/1095; H01L 29/161; H01L 29/4966; H01L 29/66174; H01L 29/66537; H01L 27/0629
See application file for complete search history.

(56) References Cited

U.S. PATENT DOCUMENTS

| | | | |
|---|---|---|---|
| 6,743,680 B1 * | 6/2004 | Yu | H01L 21/268 257/E21.335 |
| 7,009,279 B2 * | 3/2006 | Nasu | H01L 21/2807 257/351 |
| 7,078,787 B1 * | 7/2006 | Bulucea | H01L 27/0808 257/595 |
| 7,081,663 B2 * | 7/2006 | Bulucea | H01L 27/0808 257/595 |

(Continued)

*Primary Examiner* — Ida M Soward
(74) *Attorney, Agent, or Firm* — Amerson Law Firm, PLLC

(57) ABSTRACT

A semiconductor structure includes a varactor and a field effect transistor. The varactor includes a body region that includes a semiconductor material and a first gate structure over the body region. The body region is doped to have a first conductivity type. The first gate structure includes a first gate insulation layer and a first work function adjustment metal layer. The field effect transistor includes a source region, a channel region, a drain region and a second gate structure over the channel region. The source region and the drain region are doped to have a second conductivity type that is opposite to the first conductivity type. The second gate structure includes a second gate insulation layer and a second work function adjustment metal layer. The first work function adjustment metal layer and the second work function adjustment metal layer include substantially the same metal.

21 Claims, 9 Drawing Sheets

(56) References Cited

U.S. PATENT DOCUMENTS

| | | | | |
|---|---|---|---|---|
| 7,514,753 B2* | 4/2009 | Tsuchiya | H01L 21/28052 | 257/369 |
| 7,705,400 B2* | 4/2010 | Shimizu | H01L 21/26506 | 257/347 |
| 8,343,826 B2* | 1/2013 | Kronholz | H01L 21/823814 | 257/E21.431 |
| 8,445,949 B2* | 5/2013 | Anderson | H01L 27/10802 | 257/288 |
| 8,466,473 B2* | 6/2013 | Cai | H01L 21/823807 | 257/190 |
| 8,536,009 B2* | 9/2013 | Javorka | H01L 21/823412 | 257/392 |
| 8,664,066 B2* | 3/2014 | Pal | H01L 21/823807 | 257/392 |
| 8,748,270 B1* | 6/2014 | Shifren | H01L 29/66659 | 257/E21.443 |
| 8,748,275 B2* | 6/2014 | Thees | H01L 21/76232 | 257/E21.218 |
| 8,939,765 B2* | 1/2015 | Kronholz | H01L 21/823807 | 257/288 |
| 9,012,276 B2* | 4/2015 | Kapoor | H01L 29/78654 | 438/198 |
| 9,012,956 B2* | 4/2015 | Flachowsky | H01L 29/66431 | 257/192 |
| 9,087,716 B2* | 7/2015 | Yan | H01L 27/088 | |
| 9,214,512 B2* | 12/2015 | Marino | H01L 29/0615 | |
| 2005/0245038 A1* | 11/2005 | Coolbaugh | H01L 27/0808 | 438/379 |
| 2006/0043454 A1* | 3/2006 | Coolbaugh | H01L 29/94 | 257/312 |
| 2006/0125012 A1* | 6/2006 | Fathimulla | G01K 7/01 | 257/351 |
| 2006/0138548 A1* | 6/2006 | Richards, Jr. | H01L 21/2807 | 257/368 |
| 2008/0149983 A1* | 6/2008 | Rassel | H01L 29/93 | 257/312 |
| 2009/0195289 A1* | 8/2009 | Subramanian | H01L 29/86 | 327/328 |
| 2010/0006907 A1* | 1/2010 | Itokawa | H01L 21/76232 | 257/288 |
| 2010/0109044 A1* | 5/2010 | Tekleab | H01L 21/823807 | 257/190 |
| 2010/0171180 A1* | 7/2010 | Zhang | H01L 21/823807 | 257/369 |
| 2011/0175167 A1* | 7/2011 | Watanabe | H01L 21/28185 | 257/368 |
| 2011/0186912 A1* | 8/2011 | Murthy | H01L 21/823807 | 257/192 |
| 2011/0207273 A1* | 8/2011 | Jeong | H01L 21/28255 | 438/231 |
| 2011/0260261 A1* | 10/2011 | Chen | H01L 21/823807 | 257/369 |
| 2012/0138953 A1* | 6/2012 | Cai | H01L 21/823807 | 257/77 |
| 2012/0161249 A1* | 6/2012 | Kronholz | H01L 21/823807 | 257/402 |
| 2012/0199907 A1* | 8/2012 | Johnson | H01L 29/93 | 257/347 |
| 2013/0063164 A1* | 3/2013 | Hall | G01T 1/2907 | 324/679 |
| 2013/0260486 A1* | 10/2013 | Huang | H01L 29/66174 | 438/18 |
| 2014/0070321 A1* | 3/2014 | Gerhardt | H01L 21/823807 | 257/368 |
| 2014/0117409 A1* | 5/2014 | Chou | H01L 29/78615 | 257/192 |
| 2014/0246696 A1* | 9/2014 | Flachowsky | H01L 29/7848 | 257/190 |
| 2014/0252487 A1* | 9/2014 | Stephens | H01L 21/28026 | 257/368 |
| 2014/0353718 A1* | 12/2014 | Loubet | H01L 27/092 | 257/192 |
| 2015/0171086 A1* | 6/2015 | Cai | H01L 21/28008 | 257/369 |
| 2015/0214121 A1* | 7/2015 | Illgen | H01L 21/84 | 438/154 |
| 2015/0270142 A1* | 9/2015 | Liu | H01L 21/321 | 257/369 |
| 2016/0035729 A1* | 2/2016 | Yen | H01L 23/5228 | 257/296 |
| 2016/0247919 A1* | 8/2016 | Akarvardar | H01L 29/7848 | |

* cited by examiner

SEMICONDUCTOR STRUCTURE INCLUDING A VARACTOR

BACKGROUND

1. Field of the Disclosure

Generally, the present disclosure relates to integrated circuits and methods for the formation thereof, and, more particularly, to integrated circuits including capacitors whose capacitance can be adjusted by applying a voltage thereto.

2. Description of the Related Art

Integrated circuits typically include a large number of circuit elements, in particular field effect transistors. In a field effect transistor, a gate electrode is provided. The gate electrode may be separated from a channel region of the field effect transistor by a gate insulation layer that provides electrical insulation between the gate electrode and the channel region. Adjacent the channel region, a source region and a drain region that are doped to have a different conductivity type than the channel region are provided. Depending on an electric voltage applied to the gate electrode, the field effect transistor may be switched between an ON-state and an OFF-state, wherein an electrical conductivity of the channel region in the ON-state is greater than an electrical conductivity of the channel region in the OFF-state.

In addition to field effect transistors, other circuit elements, such as inductivities, resistors, diodes and capacitors, may be provided in an integrated circuit. Types of capacitors that may be provided in integrated circuits include metal oxide semiconductor capacitors (MOS capacitors). A MOS capacitor may have a configuration similar to that of a field effect transistor, wherein, however, no transitions between regions having a different conductivity type, such as those provided in a field effect transistor between the channel region and the source and drain regions, are provided. The MOS capacitor may include a body region that is provided below a gate electrode of the MOS capacitor and separated therefrom by a gate insulation layer. Adjacent the body region, highly doped semiconductor regions may be provided which are doped to have a same conductivity type as the body region and have a higher dopant concentration than the body region. A first capacitor electrode of the MOS capacitor is provided by the gate electrode, and a second capacitor electrode of the MOS capacitor is provided by the body region. The highly doped semiconductor regions adjacent the body region may be used for providing an electrical connection to the body region by means of contact holes that are formed in an interlayer dielectric above the highly doped semiconductor regions and are filled with an electrically conductive material. An additional contact hole filled with an electrically conductive material may be provided over the gate electrode for providing an electrical connection to the gate electrode.

Types of MOS capacitors include NMOS capacitors, wherein the body region is N-doped, and PMOS capacitors, wherein the body region is P-doped.

A capacitance of a MOS capacitor may be adjusted by varying a gate voltage that is applied between the gate electrode and the body region of the MOS capacitor. The application of the gate voltage may create an electric field in the body region, which may have an influence on the distribution of charge carriers in the body region. Depending on the polarity of the gate voltage, an accumulation or a depletion of majority charge carriers may be obtained in a portion of the body region adjacent the gate insulation layer.

In an NMOS capacitor, an accumulation of electrons may be obtained by applying a positive voltage to the gate electrode, and depletion of electrons may be obtained by applying a negative voltage to the gate electrode. In a PMOS capacitor, an accumulation of holes may be obtained by applying a negative voltage to the gate electrode, and a depletion of holes may be obtained by applying a positive voltage to the gate electrode. An accumulation of majority charge carriers may increase the capacity of the MOS capacitor, and a depletion of majority charge carriers may reduce the capacity of the MOS capacitor. Hence, the MOS capacitor may provide a voltage dependent capacitance, thus being a varactor. Herein, the term "varactor" will be used to denote a capacitor whose capacitance can be varied by applying a voltage thereto.

As described above, for using the full tuning range of the capacitance of the MOS varactor, it may be necessary to use both positive and negative gate voltages. For some applications, this may be disadvantageous, and it may be useful to have a device that provides a high tunability of its capacitance by using only one polarity of the gate voltage, which is denoted as "zero referenced tunability." For this purpose, it has been proposed to form the gate electrode of a MOS varactor from doped polysilicon, wherein the doping of the gate electrode is opposite to the doping of the body region. Accordingly, a P-doped gate electrode may be used in NMOS capacitors, and an N-doped gate electrode may be used in PMOS capacitors. The doping of the gate electrode may have an influence on the Fermi energy of electrons in the gate electrode, which may lead to a bending of the valance band and the conduction band of the semiconductor material of the body region in the vicinity of the gate electrode. The bending of energy bands may have an influence on the distribution of charge carriers in the body region, which may have an influence on the voltage dependency of the capacity of the MOS capacitor similar to that of a bias of the gate voltage. Thus, a zero referenced tunability of the MOS capacitor may be improved.

However, this approach may have some issues associated therewith. For doping the gate electrode of the MOS capacitor differently than the highly doped semiconductor regions adjacent the body region, masks, such as photoresist masks, may be required for blocking dopant ions in ion implantation processes that are used for doping the highly doped semiconductor regions and the gate electrode. In particular, a mask may be formed over the gate electrode when ions of a dopant of a first conductivity type, for example, ions of an N-type dopant in the case of an NMOS capacitor, are implanted into the highly doped semiconductor regions adjacent the gate electrode, and a mask may be formed over the highly doped semiconductors when ions of a dopant of a second conductivity type, for example, ions of a P-type dopant in the case of a PMOS capacitor, are implanted into the gate electrode. In order to avoid an inadvertent doping of the highly doped semiconductor regions and/or the gate electrode with dopants of the wrong conductivity type, it has been proposed to form shallow trench isolations below the sidewalls of the gate electrode. Thus, a relatively complex manufacturing process may be required for forming a MOS capacitor having a relatively high zero referenced tunability.

In view of the situation described above, the present disclosure provides semiconductor structures and varactors that may help to substantially avoid or at least reduce the above-mentioned problems, and methods for the formation of such semiconductor structures and varactors.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a varactor and a field effect transistor. The varactor includes a body region that includes a semiconductor material and a first gate structure over the body region. The body region is doped to have a first conductivity type. The first gate structure includes a first gate insulation layer and a first work function adjustment metal layer over the first gate insulation layer. The field effect transistor includes a source region, a channel region, a drain region and a second gate structure over the channel region. The source region and the drain region are doped to have a second conductivity type that is opposite to the first conductivity type. The second gate structure includes a second gate insulation layer and a second work function adjustment metal layer over the second gate insulation layer. The first work function adjustment metal layer and the second work function adjustment metal layer include substantially the same metal.

An illustrative method disclosed herein includes providing a semiconductor structure that includes a varactor region and a field effect transistor region. The varactor region includes a semiconductor material that is doped to have a first conductivity type. A gate-first process is performed. The gate-first process includes forming a gate stack over the semiconductor structure. The gate stack includes a layer of gate insulation material and a layer of work function adjustment metal over the layer of gate insulation material. The gate-first process further includes patterning the gate stack, wherein a first gate structure over the varactor region and a second gate structure over the field effect transistor region are formed from the gate stack. Additionally, the gate-first process includes forming a source region and a drain region in the field effect transistor region adjacent the second gate structure. The source region and the drain region are doped to have a second conductivity type opposite to the first conductivity type.

An illustrative varactor disclosed herein includes a body region that includes an N-doped semiconductor material and a gate structure formed over the body region. The gate structure includes a gate insulation layer and a work function adjustment metal layer over the gate insulation layer. The semiconductor material has an electron affinity and a bandgap. The work function adjustment metal layer includes a metal having a work function. An absolute value of a difference between the work function of the metal and a sum of the electron affinity and the bandgap of the semiconductor material is smaller than an absolute value of a difference between the work function of the metal and the electron affinity of the semiconductor material.

Another illustrative varactor disclosed herein includes a body region that includes a P-doped semiconductor material and a gate structure formed over the body region. The gate structure includes a gate insulation layer and a work function adjustment metal layer over the gate insulation layer. The semiconductor material has an electron affinity and a bandgap. The work function adjustment metal layer includes a metal having a work function. An absolute value of a difference between the work function of the metal and the electron affinity of the semiconductor material is smaller than an absolute value of a difference between the work function of the metal and a sum of the electron affinity and the bandgap of the semiconductor material.

A further illustrative varactor disclosed herein includes a body region including silicon germanium, a gate insulation layer over the body region and a gate electrode over the gate insulation layer. The silicon germanium is doped to have an N-type conductivity.

BRIEF DESCRIPTION OF THE DRAWINGS

The disclosure may be understood by reference to the following description taken in conjunction with the accompanying drawings, in which like reference numerals identify like elements, and in which.

Figure 1:
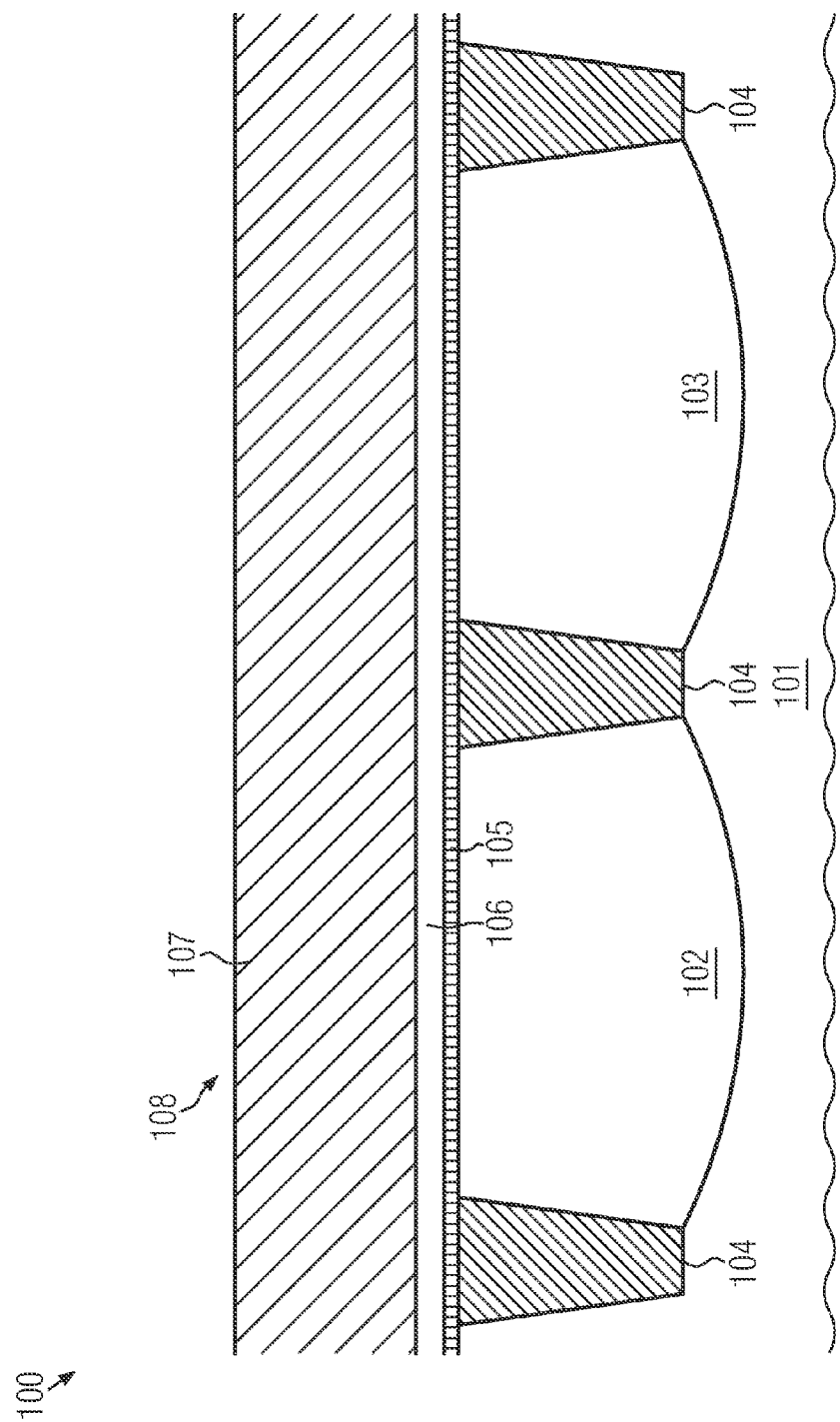
FIGS. 1-5 show schematic cross-sectional views of a semiconductor structure according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 shows a schematic cross-sectional view of a semiconductor structure 100 according to an embodiment in a stage of a method according to an embodiment. The semiconductor structure 100 includes a substrate 101. In some embodiments, the substrate 101 may be a bulk semiconductor substrate, for example, a silicon wafer. In other embodiments, the substrate 101 may be a semiconductor-on-insulator (SOI) substrate that includes a layer of a semiconductor material, for example a layer of silicon, at which circuit elements may be formed. The layer of semiconductor material may be provided over a support substrate, which may be a silicon wafer, and a layer of electrically insulating material, such as silicon dioxide, may be provided between the layer of semiconductor material and the support substrate for electrically insulating the layer of semiconductor material from the support substrate.

In a semiconductor material of the substrate 101, a varactor region 102 and a field effect transistor region 103 may be provided. The varactor region 102 and the field effect transistor region 103 may be doped, wherein a doping of the varactor region 102 and the field effect transistor region 103 may be different from a base doping of the semiconductor material of the substrate 101.

The varactor region 102 and the field effect transistor region 103 may be doped to have a same conductivity type. In some embodiments, both the varactor region 102 and the field effect transistor region 103 may be N-doped. In other embodiments, both the varactor region 102 and the field effect transistor region 103 may be P-doped. In embodiments wherein the field effect transistor region 103 is N-doped, a P-channel (PMOS) transistor may be formed in the field effect transistor region 103. In embodiments wherein the field effect transistor region 103 is P-doped, an N-channel (NMOS) transistor may be formed in the field effect transistor region 103.

The varactor region 102 and the field effect transistor region 103 may be electrically insulated from each other and from other regions wherein circuit elements in the semiconductor structure 100 will be formed (not shown) by a trench isolation structure 104.

The present disclosure is not limited to embodiments wherein the varactor region 102 and the field effect transistor region 103 are provided adjacent each other, as shown in FIG. 1. In other embodiments, the varactor region 102 and the field effect transistors region 103 may be provided at a distance to each other, and other regions wherein circuit elements in the semiconductor structure 100 will be formed may be provided between the varactor region 102 and the field effect transistor region 103.

The substrate 101, the varactor region 102, the field effect transistor region 103 and the trench isolation structure 104 may be formed by known techniques of semiconductor manufacturing. In particular, techniques of photolithography, etching, oxidation, deposition and/or chemical mechanical polishing may be employed for forming the trench isolation structure 104, and techniques of ion implantation may be used for implanting dopant ions into portions of the semiconductor material of the substrate 101 wherein the varactor region 102 and the field effect transistor region 103 are provided for doping the varactor region 102 and the field effect transistor region 103. The ion implantation may include a threshold voltage adjustment ion implantation, wherein dopant ions are primarily introduced into portions of the varactor region 102 and the field effect transistor region 103 at the surface of the semiconductor structure 100.

After the formation of the trench isolation structure 104, the varactor region 102 and the field effect transistor region 103, a gate-first manufacturing process may be performed. The gate-first process may include a formation of a gate stack 108 over the semiconductor structure 100.

The gate stack 108 may include a layer 105 of gate insulation material, a layer 106 of work function adjustment metal and a layer 107 of semiconductor material.

The layer 105 of gate insulation material may include a high-k dielectric material having a greater dielectric constant than silicon dioxide, for example, a dielectric constant greater than about 4. In some embodiments, the high-k material may include hafnium dioxide, zirconium dioxide, hafnium silicon dioxide and/or zirconium silicon dioxide. The layer 105 of gate insulation material need not be a substantially homogeneous layer of high-k dielectric material. In some embodiments, the layer 105 of gate insulation material may include sublayers that are formed of different dielectric materials. For example, the layer 105 of gate insulation material may include a silicon dioxide base layer that is formed directly on the semiconductor material of the varactor region 102 and the field effect transistor region 103 and a layer of a high-k dielectric material that is formed over the silicon dioxide base layer.

The layer 105 of gate insulation material may be formed by means of known techniques for the deposition of the materials of the layer 105 of gate insulation material, which may include chemical vapor deposition, plasma-enhanced chemical vapor deposition and/or atomic layer deposition. In embodiments wherein the layer 105 of gate insulation material includes a base layer of silicon dioxide, the base layer may be formed by means of an oxidation process wherein the semiconductor material of the substrate 101 in the varactor region 102 and the field effect transistor region 103 is exposed to an oxidizing ambient at an elevated temperature.

The layer 106 of work function adjustment metal may include a metal having a work function that is suitable for the type of the field effect transistor to be formed in the field effect transistor region 103. In embodiments wherein a P-type transistor is to be formed in the field effect transistor region 103, and wherein the field effect transistor region 103 is N-doped, in accordance with the doping of the channel region of the P-type transistor, the layer 106 of work function adjustment metal may include a PMOS work function adjustment metal such as, for example, aluminum and/or titanium nitride having a relatively high nitrogen concentration. In embodiments wherein an N-channel transistor is to be formed in the field effect transistor region 103, and wherein the field effect transistor region 103 is P-doped, in accordance with the doping of the channel region of the N-channel transistor, the layer 106 of work function adjustment metal may include an NMOS work function adjustment metal such as, for example, lanthanum, lanthanum nitride and/or titanium nitride having a relatively low nitrogen concentration. In embodiments wherein titanium nitride is used both as a PMOS work function adjustment metal and as an NMOS work function adjustment metal, the nitrogen concentration in the PMOS work function adjustment metal may be higher than the nitrogen concentration in the NMOS work function adjustment metal. Features of PMOS and NMOS work function adjustment metals will be described in more detail below.

The layer 106 of work function adjustment metal may be formed by means of techniques for the deposition of metal layers over semiconductor structures. In some embodiments, a physical vapor deposition process such as, for example, sputtering may be used. Additionally and/or alternatively, techniques of chemical vapor deposition and/or plasma-enhanced chemical vapor deposition of metals may be used.

The layer 107 of semiconductor material may include polycrystalline silicon, and it may be formed by means of techniques such as chemical vapor deposition and/or plasma-enhanced chemical vapor deposition.

Figure 2:
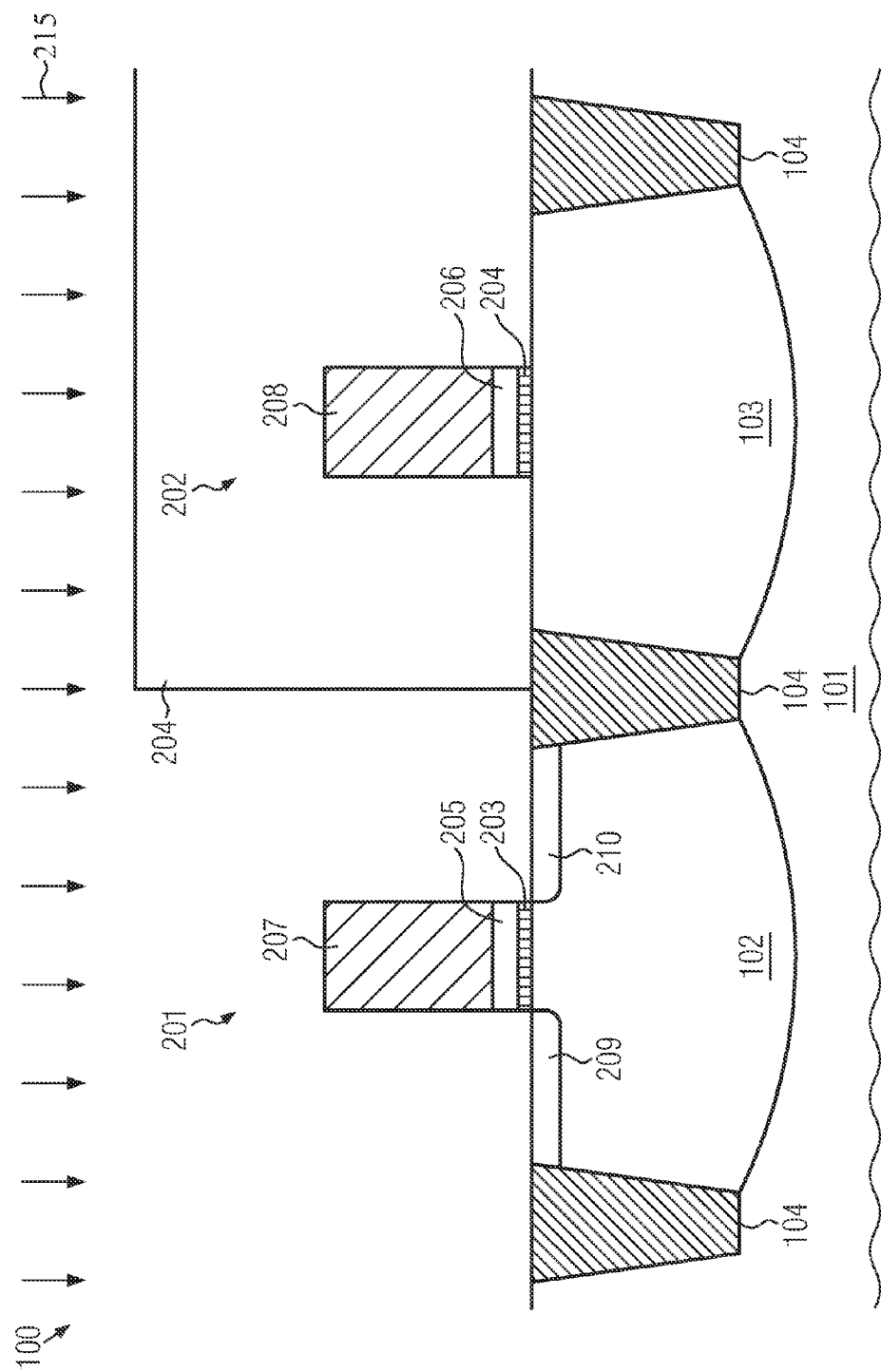

FIG. 2 shows a schematic cross-sectional view of the semiconductor structure 100 in a later stage of the manufacturing process. The gate-first process may further include patterning of the gate stack 108 (FIG. 1) to form a gate structure 201 over the varactor region 102 and a gate structure 202 over the field effect transistor region 103. This may be done by means of known techniques that are used in the formation of gate electrodes of field effect transistors by means of gate-first processes and which may include photolithography and etching.

The gate structure 201 over the varactor region 102 may include a gate insulation layer 203 that is formed from a portion of the layer 105 of gate insulation material, a work function adjustment metal layer 205 that is formed from a portion of the layer 106 of work function adjustment metal and a semiconductor layer 207 that is formed from a portion of the layer 107 of semiconductor material.

The gate structure 202 over the field effect transistor region 103 may include a gate insulation layer 204 that is formed from a portion of the layer 105 of gate insulation material, a work function adjustment metal layer 206 that is formed from a portion of the layer 106 of work function adjustment metal and a semiconductor layer 208 that is formed from a portion of the layer 107 of semiconductor material.

Since the gate insulation layers 203, 204 of the gate structures 201, 202 have both been formed from portions of the layer 105 of gate insulation material, the gate insulation layers 203, 204 may include substantially the same one or more materials. Additionally, since the work function adjustment metal layers 205, 206 of the gate structures 201, 202 have both been formed from portions of the layer 106 of work function adjustment metal, the layers 205, 206 of work function adjustment metal may include substantially the same metal. In particular, work functions of the layers 205, 206 of work function adjustment metal may be approximately equal. Furthermore, since the semiconductor layers 207, 208 have both been formed from portions of the layer 107 of semiconductor material, the semiconductor layers 207, 208 may include substantially the same semiconductor material.

The semiconductor layers 207, 208 need not be the topmost layers of the gate structures 201, 202. In some embodiments, each of the gate structures 201, 202 may additionally include a capping layer (not shown) that is provided over the semiconductor layer 207 and the semiconductor layer 208, respectively. The capping layer may be formed of silicon nitride, and it may be used as a hardmask in the patterning of the gate stack 108 that is performed for forming the gate structures 201, 202.

The process may further include performing ion implantation processes 215, 302, 404, 502, which will be described in the following with reference to FIGS. 2, 3, 4 and 5, respectively.

After the formation of the gate structures 201, 202, a mask 204 may be formed over the semiconductor structure 100. In some embodiments, the mask 204 may be a photoresist mask, and it may be formed by means of photolithography.

The mask 204 may cover the field effect transistor region 103 but not the varactor region 102. After the formation of the mask 204, an ion implantation process 215 may be performed. In the ion implantation process 215, the semiconductor structure 100 may be irradiated with ions of a dopant of the same conductivity type as the initial doping of the varactor region 102 and the field effect transistor region 103. In particular, in embodiments wherein the varactor region 102 and the field effect transistor region 103 are N-doped, in the ion implantation process 215, the semiconductor structure 100 may be irradiated with ions of an N-type dopant. In embodiments wherein the varactor region 102 and the field effect transistor 103 are P-doped, in the ion implantation process 215, the semiconductor structure 100 may be irradiated with ions of a P-type dopant. In the ion implantation process 215, dopant may be included into portions of the varactor region adjacent the gate structure 201, wherein the dopant concentration is increased. Thus, portions 209, 210 of highly doped semiconductor regions may be formed adjacent the gate structure 201. Dopant ions impinging on the gate structure 201 may be absorbed by the gate structure 201, so that substantially no dopants are introduced into the portion of the varactor region 102 below the gate structure 201. Thus, the portions 209, 210 of the highly doped semiconductor regions may be self-aligned to the gate structure 201. Moreover, due to the absorption of dopant ions by the gate structure 201, the semiconductor layer 207 of the gate structure 201 may be doped.

Ions impinging on the mask 204 over the field effect transistor region 103 may be absorbed by the mask so that substantially no dopants are introduced into the field effect transistor region 103 in the ion implantation process 215.

Figure 3:
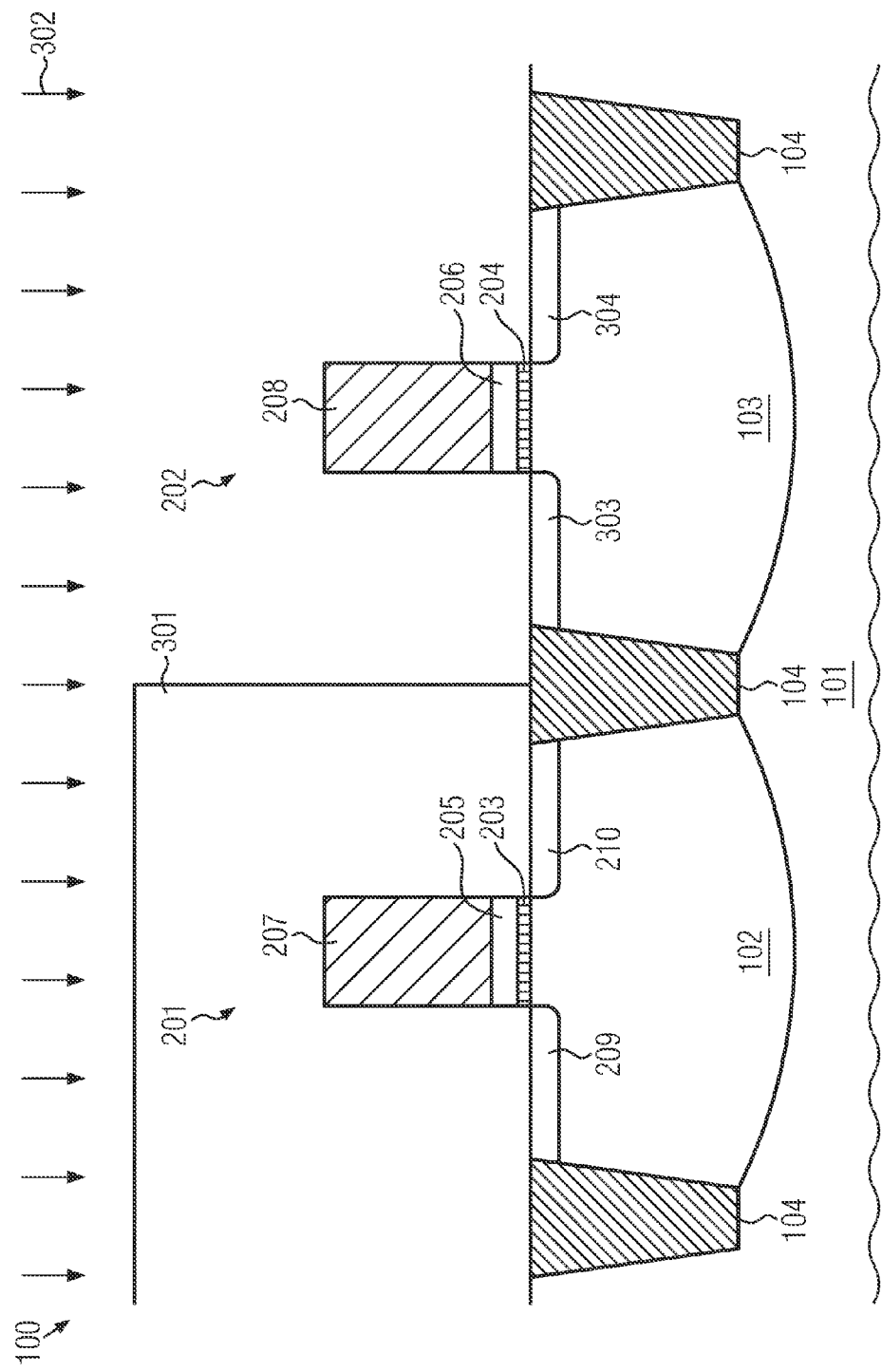

FIG. 3 shows a schematic cross-sectional view of the semiconductor structure 100 in a later stage of the manufacturing process. After the ion implantation process 215, the mask 204 may be removed by means of a resist strip process, and a mask 301 may be formed over the semiconductor structure 100. The mask 301 may be a photoresist mask, and it may be formed by means of photolithography. The mask 301 may cover the varactor region 102 but not the field effect transistor region 103.

Then, an ion implantation process 302 may be performed in the presence of the mask 301. In the ion implantation process 302, the semiconductor structure 100 may be irradiated with ions of a dopant of a conductivity type that is opposite to the initial doping of the varactor region 102 and the field effect transistor region 103. In particular, in embodiments wherein a P-type field effect transistor is to be formed in the field effect transistor region 103, and the varactor region 102 and the field effect transistor region 103 are initially N-doped, in the ion implantation process 302, the semiconductor structure 100 may be irradiated with ions of a P-type dopant. In embodiments wherein the varactor region 102 and the field effect transistor region 103 are initially P-doped, the semiconductor structure 100 may be irradiated with ions of an N-type dopant in the ion implantation process 302. Thus, a source extension 303 and a drain extension 304 may be formed adjacent the gate structure 202, and the semiconductor layer 208 of the gate structure 202 may be doped. Then, the mask 301 may be removed by means of a resist strip process.

The present disclosure is not limited to embodiments wherein the portions 209, 210 of the highly doped semiconductor regions are formed before the source extension 303 and the drain extension 304. In other embodiments, the formation of the mask 204 and the ion implantation process 215, on the one hand, and the formation of the mask 301 and the ion implantation process 302, on the other hand, may be performed in a different order so that the source extension 303 and the drain extension 304 are formed before the portions 209, 210 of the highly doped semiconductor regions.

Figure 4:
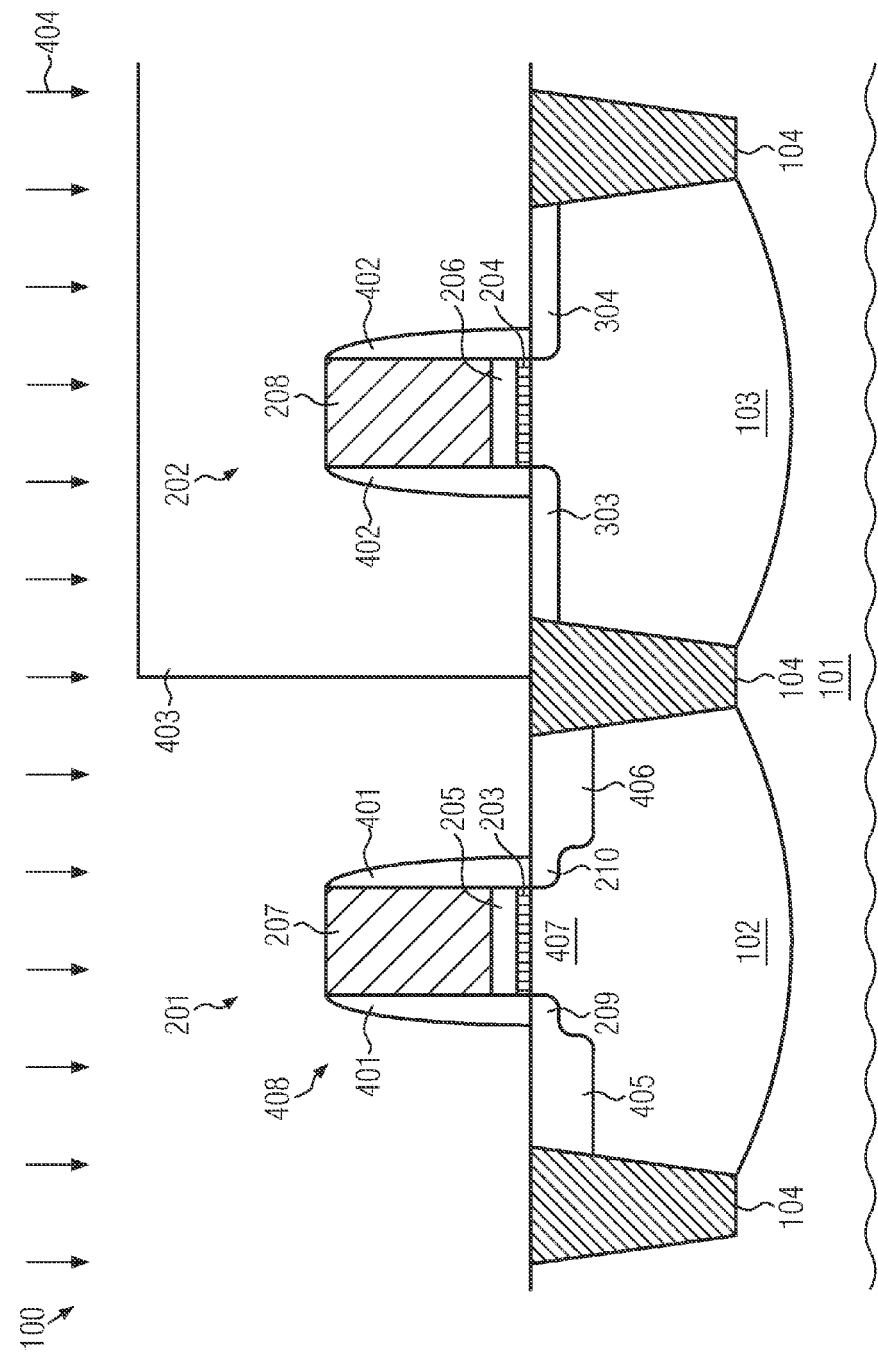

FIG. 4 shows a schematic cross-sectional view of the semiconductor structure 100 in a later stage of the manufacturing process. The gate-first process may include a formation of a sidewall spacer structure 401 adjacent the gate structure 201 and a formation of a sidewall spacer structure 402 adjacent the gate structure 202. For forming the sidewall spacer structures 401, 402, a layer of a sidewall spacer material, for example, a layer of silicon nitride, may be deposited over the semiconductor structure 100 by means of a deposition process such as chemical vapor deposition or plasma-enhanced chemical vapor deposition. The deposition process used for forming the layer of sidewall spacer material may be a substantially isotropic deposition process. Thereafter, an anisotropic etch process may be performed for removing portions of the layer of sidewall spacer material over substantially horizontal portions of the semiconductor structure 100, whereas, due to the anisotropy of the etch process, portions of the layer of sidewall spacer material over inclined portions of the semiconductor structure 100, such as the sidewalls of the gate structures 201, 202, remain in the semiconductor structure 100 and form the sidewall spacer structures 401, 402.

After the formation of the sidewall spacer structures 401, 402, a mask 403, for example, a photomask, may be formed over the semiconductor structure 100, for example, by means of photolithography. The mask 403 may cover the field effect transistor region 103 but not the varactor region 102.

Thereafter, an ion implantation process 404 may be performed. In the ion implantation process 404, the semiconductor structure 100 may be irradiated with ions of a dopant of the same conductivity type as the initial doping of the varactor region 102 and the field effect transistor region 103. Thus, a rest of highly doped semiconductor regions 405, 406 adjacent the gate structure 201 may be formed.

An ion energy used in the ion implantation process 404 may be greater than the ion energy used in the ion implantation process 215 so that a dopant profile as schematically illustrated in FIG. 4 may be obtained adjacent the sidewalls of the gate structure 201. Furthermore, an ion dose used in the ion implantation process 404 may be greater than an ion dose used in the ion implantation process 215.

Ions impinging on the gate structure 201 and the sidewall spacer structure 401 in the ion implantation process 404 may be absorbed so that the highly doped semiconductor regions 405, 406 are formed in a self-aligned manner, and a doping of the semiconductor layer 207 of the gate structure 201 is obtained.

Since, in each of the ion implantation processes 215, 404, ions of dopants of a same conductivity type as the initial doping of the varactor region 102 are used, there are no PN transitions between the highly doped semiconductor regions 405, 406 and the rest of the varactor region 102. However, a dopant concentration in the highly doped semiconductor regions 405, 406 may be greater than a dopant concentration in a rest of the varactor region 102. In particular, a dopant concentration in the highly doped semiconductor regions 405, 406 may be greater than a dopant concentration in a body region 407 below the gate structure 201.

Since the highly doped semiconductor regions 405, 406 may be formed in a self-aligned manner, no trench isolation structures need to be provided between the highly doped semiconductor regions 405, 406 and the body region 407 so that the highly doped semiconductor regions 405, 406 may be contiguous with the body region 407 directly below the sidewalls of the gate structure 201.

The varactor region 102, the highly doped semiconductor regions 405, 406 including the portions 209, 210, the gate structure 201 and the sidewall spacer 401 form a varactor 408.

Figure 5:
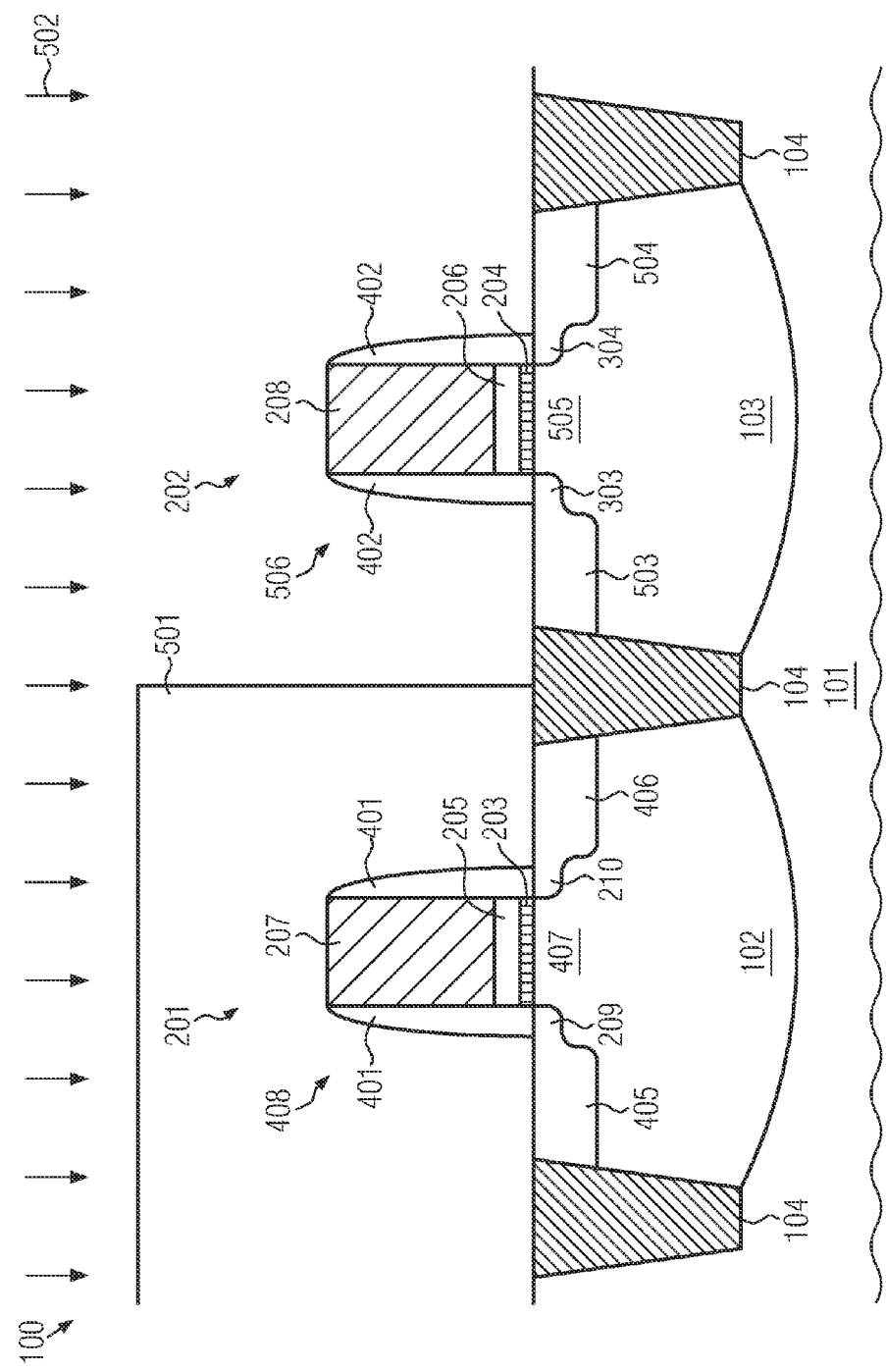

FIG. 5 shows a schematic cross-sectional view of the semiconductor structure 100 in a later stage of the manufacturing process. The mask 403 may be removed by means of a resist strip process, and a mask 501, for example, a photoresist mask, may be formed over the semiconductor structure 100. The mask 501 may cover the varactor region 102 but not the field effect transistor region 103. Thereafter, an ion implantation process 502 may be performed. In the ion implantation process 502, the semiconductor structure 100 may be irradiated with ions of a dopant of a conductivity type that is opposite to the conductivity type of the initial doping of the varactor region 102 and opposite to the conductivity type of the initial doping of the field effect transistor region 103. However, a conductivity type of the dopants implanted into the semiconductor structure 100 in the ion implantation process 502 may be the same as the conductivity type of the source extension 303 and the drain extension 304. In the ion implantation process 502, a source region 503 and a drain region 504 may be formed adjacent the gate structure 202, and the semiconductor layer 208 of the gate structure 202 may be doped. A doping of a channel region 505 below the gate structure 202 may substantially correspond to the initial doping of the field effect transistor region 103 so that there is a PN transition between the channel region 505, on the one hand, and the source region 503, the drain region 505, the source extension 303 and the drain extension 304, on the other hand.

The field effect transistor region 103, the source region 503, the drain region 504, the source extension 303, the drain extension 304, the channel region 505, the gate structure 202 and the sidewall spacer 402 form a field effect transistor 506.

After the ion implantation process 502, the mask 501 may be removed by means of a resist strip process. Thereafter, further semiconductor manufacturing processes may be performed. These may include a formation of a silicide in each of the highly doped semiconductor regions 405, 406, the source region 503 and the drain region 504. Optionally, a silicide may also be formed in the layers 207, 208 of semiconductor material of the gate structures 201, 202. Furthermore, an annealing process may be performed for activating dopants in the varactor region 102, the field effect transistor region 103, the highly doped semiconductor regions 405, 406, including the portions 209, 210, the source region 503, the drain region 504, the source extension 303, and the drain extension 304. Furthermore, in the annealing process, dopants in the semiconductor layers 207, 208 of the gate structures 201, 202 may be activated. An interlayer dielectric may be deposited over the semiconductor structure 100, and contacts, being provided in the form of contact holes filled with an electrically conductive material such as tungsten, may be formed in the interlayer dielectric for providing electrical connections to the highly doped semiconductor regions 405, 406, the source region 503, the drain region 504 and the gate structures 201, 202. Thereafter, back-end-of-line processes may be performed for completing the formation of an integrated circuit from the semiconductor structure 100.

Figure 6:
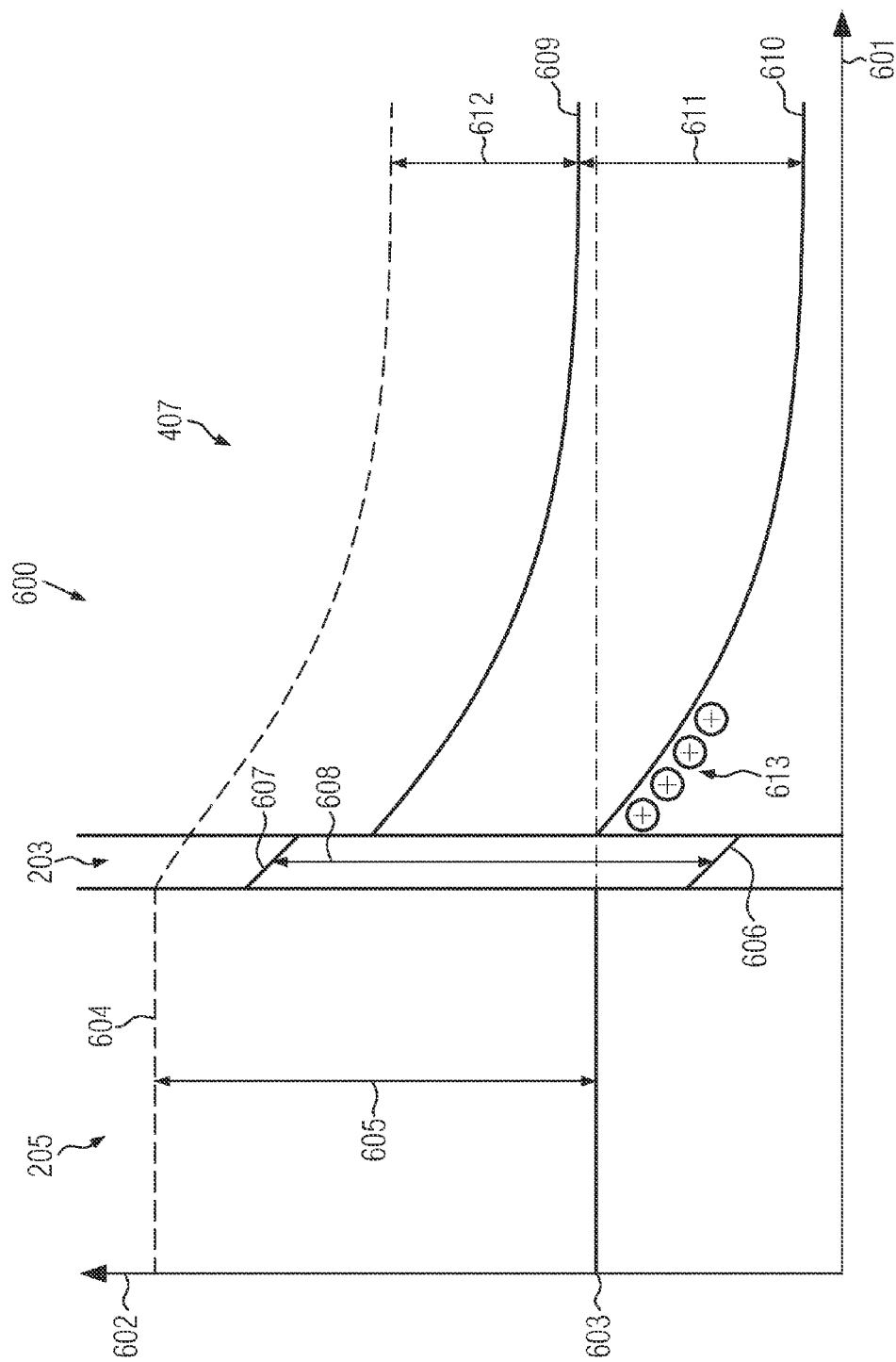
FIG. 6 schematically illustrates energy levels and band structures in a varactor according to an embodiment.

In the following, features of the varactor 408 will be described in more detail with reference to FIGS. 6 and 7. FIG. 6 shows a schematic diagram 600 illustrating energy levels of electrons in the varactor 100 in embodiments wherein the varactor region 102 and, in particular, the body region 407 is N-doped, so that the varactor 408 is provided in the form of an NMOS capacitor. The energy levels shown in FIG. 6 are those obtained in the absence of a gate voltage applied to the gate structure 201.

A horizontal coordinate axis 601 denotes positions along a depth direction of the semiconductor structure 100 that extends from the work function adjustment metal layer 205 in the gate structure 201 of the varactor 408 through the gate insulation layer 203 of the varactor 408 into the body region 407 of the varactor 408. In the plane of drawing of the cross-sectional view of FIG. 5, the depth direction of the semiconductor structure 100 extends downward in the vertical direction.

A vertical coordinate axis 602 denotes the energy of electrons. A dashed line 604 denotes a vacuum energy level of electrons.

The metal of the work function adjustment metal layer 205 has a work function 605, being an energy difference between the vacuum energy level 604 and a Fermi energy 603 of electrons in the work function adjustment metal layer 205. The Fermi energy 603 of electrons in the work function adjustment metal layer 205 may be substantially equal to a Fermi energy of electrons in the gate insulation layer 203 and the body region 407, due to the formation of a thermal equilibrium in the varactor 408, as illustrated by a dashed line extending through the gate insulation layer 203 and the body region 407 at the Fermi energy 603.

As already mentioned above, in embodiments wherein the body region 407 of the varactor 408 is N-doped, the metal of the work function adjustment metal layer may be a PMOS work function adjustment metal that is suitable for adjusting a threshold voltage of the field effect transistor 506, which, in such embodiments, may be a P-channel transistor. In accordance with conventional techniques for work function engineering in P-channel transistors, the work function 605 of the work function adjustment metal layer 205 may have a value in a range from about 5.3 eV to about 4.7 eV, for example, a work function of about 5 eV.

Reference numeral 606 denotes a valance band edge of the gate insulation layer 203 and reference numeral 607 denotes a conduction band edge of the gate insulation layer 203. Electrons in the valance band of the gate insulation layer 203 have an energy smaller than the energy of the valance band edge 606, and electrons in the conduction band of the gate insulation layer 203 have an energy that is greater than the conduction band edge 607. Between the valance band edge 606 and the conduction band edge 607, there is a bandgap 608. Since the gate insulation layer 203 is formed from a dielectric material, the bandgap 608 may be relatively large.

Reference numeral 610 denotes a valance band edge of the semiconductor material of the body region 407 which may include silicon, for example, in some embodiments, silicon that is substantially pure apart from the presence of dopants. Reference numeral 609 denotes a conduction band edge of the semiconductor material of the body region 407. Electrons in the valance band have an energy that is smaller than the valance band edge 610, and electrons in the conduction band have an energy that is greater than the energy of the conduction band edge 609. Between the valance band edge 610 and the conduction band edge 609, there is a bandgap 611. An energy difference between the vacuum level 604 and the conduction band edge 609 corresponds to an electron affinity 612 of the semiconductor material of the body region 407. In embodiments wherein the body region 407 includes substantially pure silicon, the electron affinity 612 may have a value of about 4.1 eV, and the bandgap 611 may have a value of about 1.1 eV.

In embodiments wherein the body region 407 of the varactor 408 is N-doped, at a distance to the gate insulation layer 203 of the varactor, the Fermi energy 603 is close to the conduction band edge 609, so that an absolute value of an energy difference between the Fermi energy 603 and the conduction band edge 609 is smaller than an absolute value of an energy difference between the Fermi energy 603 and the valance band edge 610. The electron affinity 612 may be smaller than the work function 605 of the work function adjustment metal layer 205. An absolute value of a difference between the work function 605 and a sum of the electron affinity 612 and the bandgap 611 may be smaller than a difference between an absolute value of an energy difference between the work function 605 and the electron affinity 612. Since the Fermi energy 603 is relatively close to the conduction band edge 609 at a distance to the gate insulation layer 203, a positive space charge 613 may be obtained in the vicinity of the gate insulation layer 203, and a bending of the conduction band edge 609 and the valance band edge 610 may be obtained in the vicinity of the gate insulation layer 203. Moreover, the vacuum energy level 604 may be at a different energy at a distance to the gate insulation layer 203 than in the vicinity of the gate insulation layer 203.

Due to the presence of the positive space charge 613 in the N-doped body region 407 in the vicinity of the gate insulation layer 203, a state of the body region 407 similar to that obtained in the case of a depletion in the body region 407 may be obtained even in the absence of a gate voltage applied to the gate structure 201. Thus, a relatively small capacity of the varactor 408 may be obtained in the absence of a gate voltage applied to the gate structure 201 of the varactor 408. By applying a positive voltage to the gate structure 201 of the varactor 408, the positive space charge 613 in the vicinity of the gate insulation layer 203 may be reduced, and an accumulation of electrons in the vicinity of the gate insulation layer 203 may be obtained. Thus, the capacity of the varactor 408 may be increased.

Thus, a relatively large tuning range of the varactor 408 may be obtained, even if only one voltage polarity is applied to the gate structure 201 of the varactor 408. Thus, a relatively high zero reference tunability of the varactor 408 may be provided.

Figure 7:
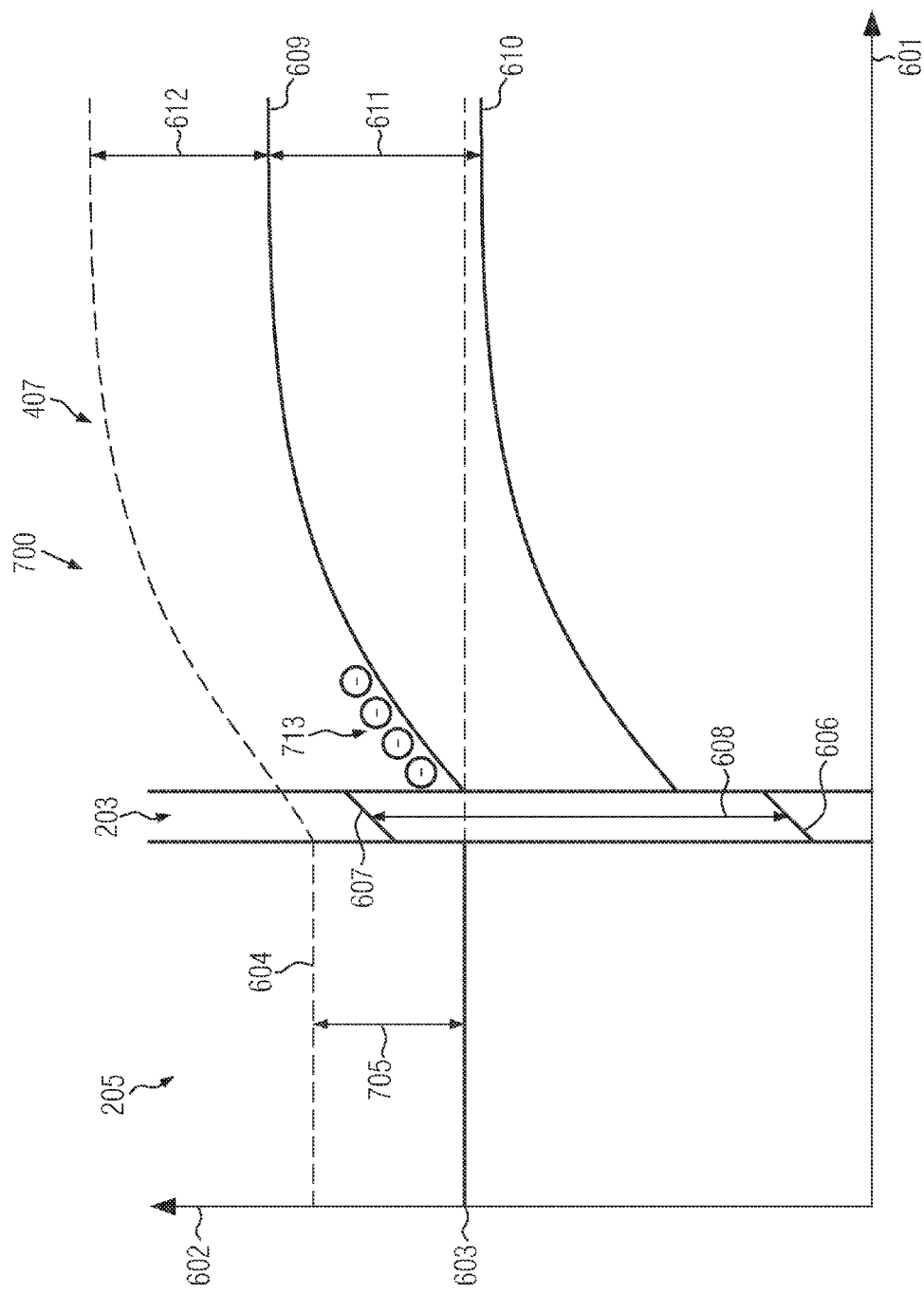
FIG. 7 schematically illustrates energy levels and band structures in a varactor according to an embodiment.

FIG. 7 shows a schematic diagram illustrating energy levels of electrons in the varactor 408 in embodiments wherein the body region 407 is P-doped, and wherein the work function adjustment metal layer 205 includes an NMOS work function adjustment metal in the absence of a gate voltage applied to the gate structure 201. For convenience, in FIG. 6, on the one hand, and in FIG. 7, on the other hand, like reference numerals have been used to denote like features, and a detailed description thereof will sometimes be omitted.

The NMOS work function adjustment metal of the work function adjustment metal layer 205 may be selected so as to have a work function 705 that is suitable for adjustment of a threshold voltage of the field effect transistor 506, which may be an N-channel field effect transistor. In some embodiments, the work function 705 of the work function adjustment metal layer 205 may have a value in a range of about 4.4 eV to about 3.8 eV, for example, a value of about 4.1 eV.

Thus, in embodiments wherein the body region 407 of the varactor 408 includes silicon, the work function 705 of the work function adjustment metal layer 205 may be close to the electron affinity 612 of the semiconductor material of the body region 407. In particular, an absolute value of a difference between the work function 705 and the electron affinity 612 may be smaller than an absolute value of a difference between the work function 705 and a sum of the electron affinity 612 and the bandgap 611 of the semiconductor material of the body region 407. The Fermi energy 603 of the work function adjustment metal layer 205, which differs from a vacuum energy level 604 by the work function 705, may also define the Fermi energy in the gate insulation layer 203 and the body region 407 due to the formation of a thermal equilibrium. In embodiments wherein the semiconductor material of the body region 407 is P-doped, at a distance to the gate insulation layer 203, the Fermi energy 603 may be close to the valence band edge 610. Therefore, in the vicinity of the gate insulation layer 203, a bending edge 609 of the conduction band edge 610 and the valance band of the semiconductor material of the body region 407 and a formation of a negative space charge 713 may be obtained in the absence of a gate voltage applied to the gate structure 201 of the varactor 408. The vacuum level 604 of the energy of electrons in the semiconductor material of the body region 407 may be different than the vacuum energy level 604 in the work function adjustment metal layer 205.

Due to the negative space charge 713 in the vicinity of the gate insulation layer 203, a state of the body region 407 similar to a depletion may be obtained even when no gate voltage is applied to the gate structure 201 of the varactor 408. By applying a negative gate voltage to the gate structure 201, an accumulation of positive majority charge carriers in the body region 407 may be obtained, which may increase the capacity of the varactor 408. Thus, a relatively large tuning range of the capacity of the varactor 408 may be obtained without applying a positive gate voltage to the gate structure 201 of the varactor 408. Thus, a relatively high zero reference tunability of the varactor 408 may be obtained.

The present disclosure is not limited to embodiments wherein the body region of a varactor and the channel region of a field effect transistor are formed of silicon which is substantially pure apart from the presence of dopants. In other embodiments, semiconductor materials other than substantially pure silicon may be provided in the varactor and the field effect transistor. In the following, such embodiments will be described with reference to FIG. 8. For convenience, in FIGS. 1-7, on the one hand, and in FIG. 8, on the other hand, like reference numerals have been used to denote like components. Components denoted by like reference numerals may have corresponding features, and corresponding methods may be used for the formation thereof.

Figure 8:
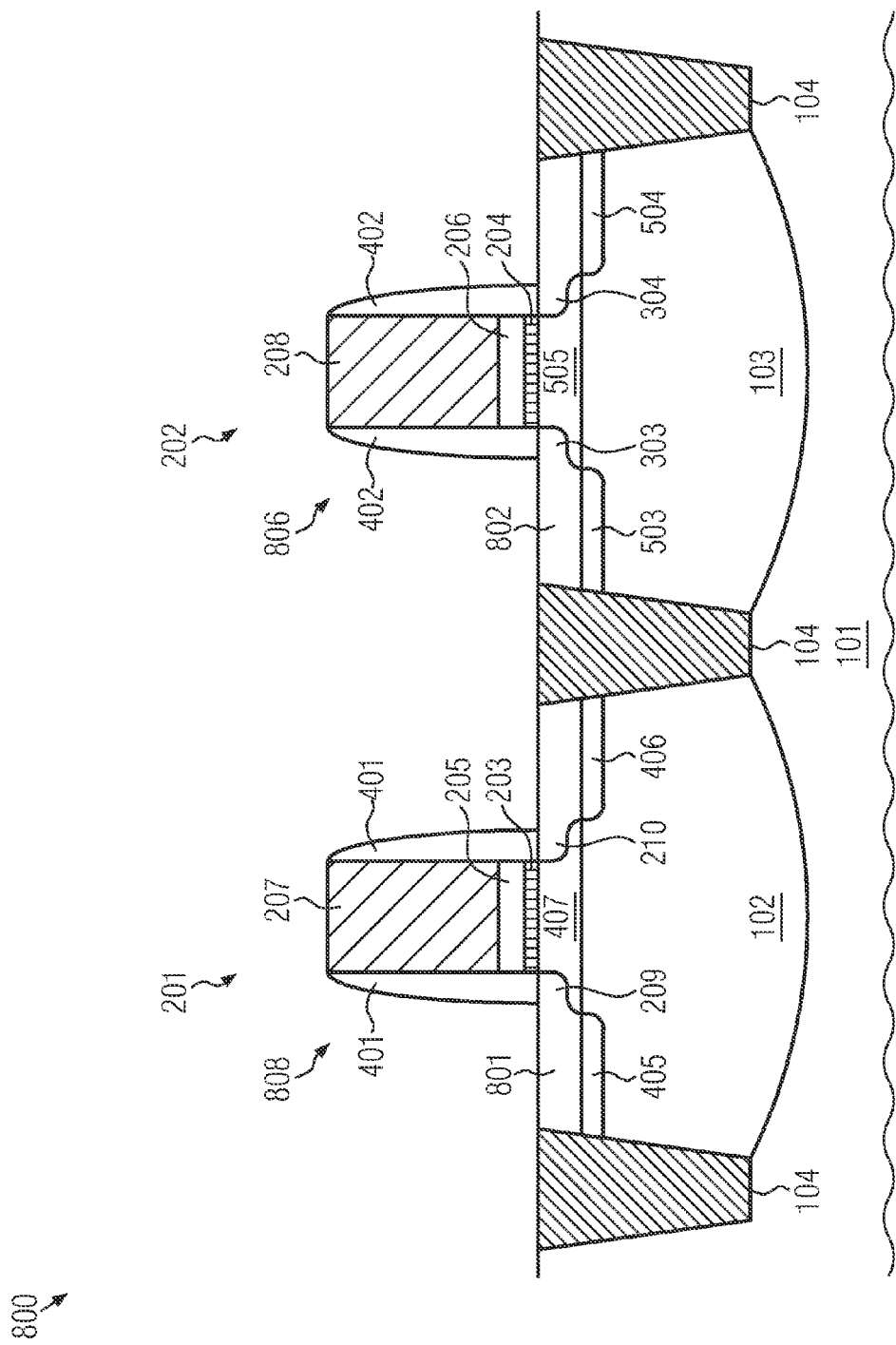
FIG. 8 shows a schematic cross-sectional view of a semiconductor structure according to an embodiment.

FIG. 8 shows a schematic cross-sectional view of a semiconductor structure 800 that includes a varactor region 102 and a field effect transistor region 103 that are formed on a substrate 101. A varactor 808 may be provided at the varactor region 102 and a field effect transistor 806 may be provided at the field effect transistor region 103. A trench isolation structure 104 may provide electrical insulation between the varactor region 102 and the field effect transistor region 103, and between the varactor region 102 and the field effect transistor region 103 and other circuit elements (not shown) in the semiconductor structure 800. Over the varactor region 102, a gate structure 201 may be provided. Over the field effect transistor region 103, a gate structure 202 may be provided.

The gate structure 201 includes a gate insulation layer 203, which may be formed from substantially the same material as a gate insulation layer 204 in the gate structure 202. Additionally, the gate structures, 201, 202 may include a work function adjustment metal layer 205 and a work function adjustment metal layer 206, respectively, which may include substantially the same metal. Moreover, the gate structure 201 may include a semiconductor layer 207, and the gate structure 202 may include a semiconductor layer 208.

The varactor 808 may include a silicon germanium layer 801, which extends below the gate structure 201. Similarly, the field effect transistor 202 may include a silicon germanium layer 802, which extends below the gate structure 202.

The varactor 808 may further include highly doped semiconductor regions 405, 406, which are provided adjacent the gate structure 201. The highly doped semiconductor regions 405, 406 may include portions 209, 210 that extend below the sidewall spacer structure 401. A conductivity type of the highly doped semiconductor regions 405, 406 may be the same as the conductivity type of the rest of the varactor region 102, wherein, however, the highly doped semiconductor regions 405, 406 may have a higher dopant concentration than the rest of the varactor region 102. In particular, a dopant concentration in the highly doped semiconductor regions 405, 406 may be higher than a dopant concentration in a body region 407 below the gate structure 201. The body region 407 of the varactor 808 may at least partially be formed in the silicon germanium layer 801, so that the body region 407 includes silicon germanium.

The field effect transistor 806 may include a source region 503, a drain region 504, a source extension 303 and a drain extension 304. The source region 503, the drain region 504, the source extension 303 and the drain extension 304 may be doped to have a conductivity type that is opposite to the conductivity type of the rest of the field effect transistor region 103, in particular opposite to the conductivity type of a channel region 505 below the gate structure 202. At least a part of the channel region 505 may be provided in the silicon germanium layer 802, so that the channel region 505 of the field effect transistor 806 includes silicon germanium.

The body region 407 of the varactor 808 and the channel region 505 of the field effect transistor 806 may have the same conductivity type, so that the source region 503, the drain region 504, the source extension 303 and the drain extension 304 are doped to have a conductivity type that is opposite to the conductivity type of the body region 407.

In some embodiments, the field effect transistor 806 may be a P-channel transistor, wherein the source region 503, the drain region 504, the source extension 303 and the drain extension 304 are P-doped, and the channel region 505 is N-doped. In such embodiments, the silicon germanium in the channel region 505 may help to provide an improved mobility of holes in the channel region 505 compared to embodiments wherein the channel region 505 includes substantially pure silicon.

In embodiments wherein the field effect transistor 806 is a P-channel transistor, the work function adjustment metal layers 205, 206 may include a PMOS work function adjustment metal having features similar to those of the PMOS work function adjustment metals described above with reference to FIGS. 1-7.

The presence of silicon germanium in the body region 407 of the varactor 808 may have an influence on the dependency of the capacitance of the varactor 808 on the gate voltage applied between the gate structure 201 and the body region 407. In particular, a smaller slope dC/dD of a curve of the capacity C as a function of the gate voltage V may be obtained, which may help to improve the control of the capacitance of the varactor 808 with the gate voltage.

For forming the silicon germanium layers 801, 802 of the varactor 808 and the field effect transistor 806, known techniques for the formation of channel silicon germanium layers in field effect transistors, which may include an epitaxial growth of silicon germanium, may be used. The other features of the semiconductor structure 800 may be formed as described above with reference to FIGS. 1-7.

Figure 9:
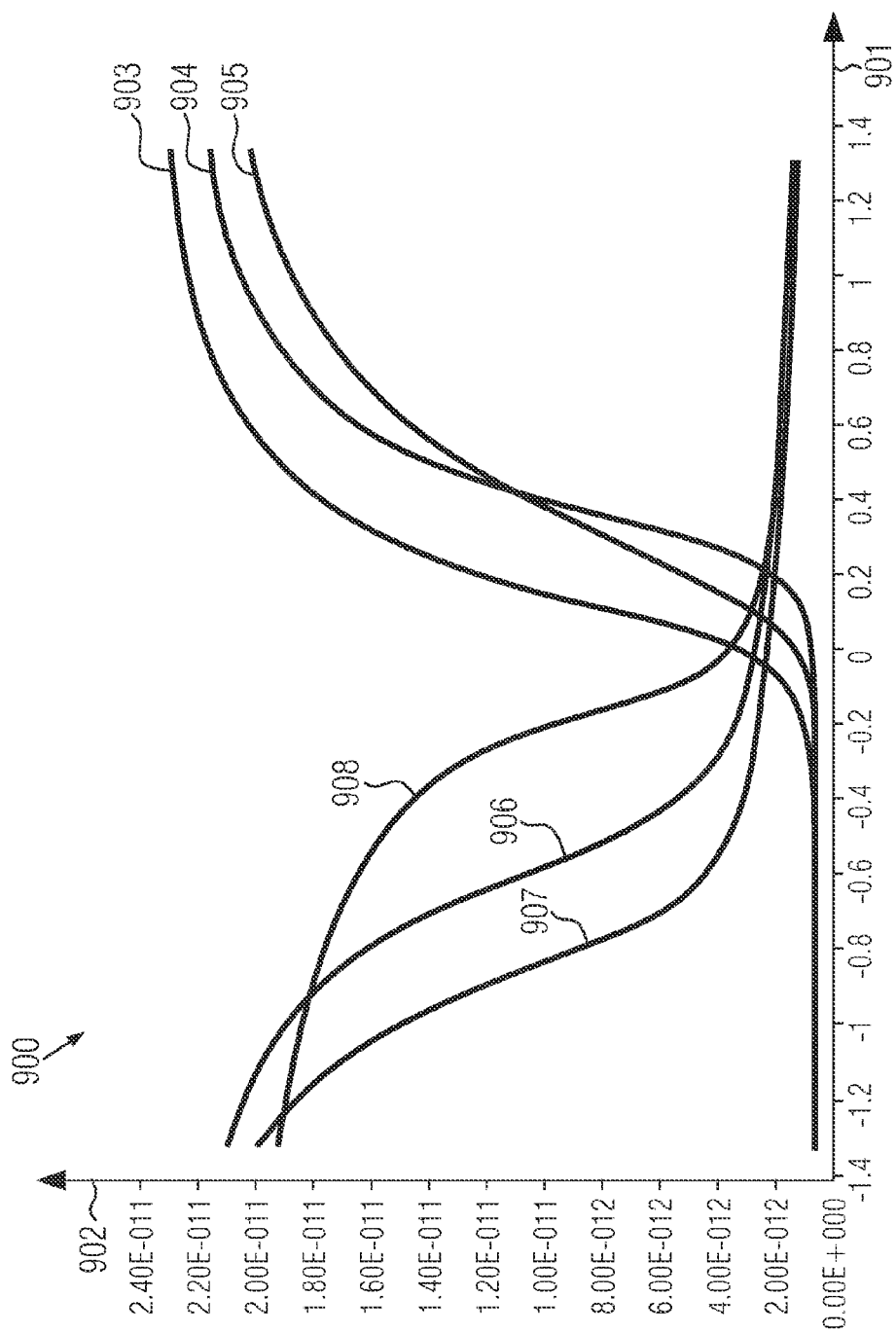
FIG. 9 shows a diagram illustrating results of measurements of a voltage dependency of a capacity of varactors.

FIG. 9 shows a diagram 900 illustrating results of experiments wherein the capacitance of varactors that include varactors in accordance with embodiments described herein was measured in dependency of the gate voltage applied between the gate structure and the body region of the varactors. In the diagram 900, a horizontal coordinate axis 901 denotes the gate voltage in the unit "volt" and a vertical coordinate axis 902 denotes the capacitance in the unit "farad." The curves have been measured for devices having an area of about 907.2 $\mu m^2$. Therefore, values of the capacitance per area in the unit "fF/$\mu m^2$" may be obtained by multiplying the values on the vertical coordinate axis by $10^{15}$/907.2. Curves 903 to 908 illustrate the dependency of the capacitance of the varactors on the gate voltage, wherein each of the curves shows a median of a number of measurements that were obtained at a measurement frequency of 1 MHz.

Curve 904 denotes the voltage dependency of capacitors in accordance with the embodiments described above with reference to FIGS. 1-7, wherein the body region 407 is N-doped and a PMOS work function adjustment metal is provided in the work function adjustment metal layer 205. As can be seen from FIG. 9, a relatively small capacitance may be obtained at a gate voltage of zero volt and the capacitance of the varactor may be increased by applying a positive gate voltage. Thus, a relatively high zero reference tunability is obtained.

Curve 903 shows a voltage dependency of the capacitance of varactors similar to those of the embodiments described above with reference to FIGS. 1-7, wherein the body region 407 is N-doped and wherein an NMOS work function adjustment metal is used instead of the PMOS work function adjustment metal for comparison purposes. As can be seen from FIG. 9, in such varactors, a substantially higher capacitance is obtained at a gate voltage of zero volt, and the curve 903 is shifted relative to the curve 904 in the direction opposition to the direction of the coordinate axis 901. Thus, as can be seen by comparison of curves 903 and 904, by providing the PMOS work function adjustment metal, which may also be used in P-channel field effect transistors, the curve illustrating the dependency of the capacitance on the gate voltage may be shifted to the positive voltage side of the gate voltage.

Curve 907 shows the dependency of the capacitance of a capacitor in accordance with the embodiments described above with reference to FIGS. 1-7, wherein the body region 407 is P-doped, and wherein an NMOS work function adjustment metal is provided in the work function adjustment metal layer 205. Curve 906 shows the voltage dependency of the capacitance of a similar capacitor, wherein, however, a PMOS work function adjustment metal is provided in the work function adjustment metal layer for comparison purposes. As can be seen from curves 906, 907, by providing an NMOS work function adjustment metal, which may also be used in N-channel field effect transistors, in the work function adjustment metal layer of the varactor having an N-doped body region 407, the curve illustrating the dependency of the capacitance on the gate voltage may be shifted to the negative voltage side of the gate voltage. Thus, a relatively high zero reference tunability may be obtained.

Curve 905 shows the dependency of the capacitance of a varactor similar to the varactor 808 described above with reference to FIG. 8, wherein silicon germanium is provided in the body region 407 of the varactor 808 and the body region 407 is N-doped. As can be seen by comparison of curves 904 and 905, providing silicon germanium in the body region of the varactor may reduce the slope of the curve illustrating the dependency of the capacitance on the gate voltage. Curve 908 shows the dependency of the capacitance of a varactor similar to the varactor 808 described above with reference to FIG. 8, wherein silicon germanium is provided in the body region 407 and wherein the body region 407 is P-doped. As can be seen by comparison of curves 907 and 908, providing silicon germanium in the body region 407 may have an influence on the voltage dependency of the capacitance of the varactor.

The present disclosure is not limited to embodiments wherein semiconductor structures and varactors are formed by means of gate-first processes. In other embodiments, replacement gate techniques may be used for the formation of semiconductor structures and varactors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor structure, comprising:
    a varactor comprising a body region comprising a semiconductor material and a first gate structure over said body region, wherein said body region is doped to have a first conductivity type and wherein said first gate structure comprises a first gate insulation layer and a first work function adjustment metal layer over said first gate insulation layer; and
    a field effect transistor comprising a source region, a channel region, a drain region and a second gate structure over said channel region, wherein said source region and said drain region are doped to have a second conductivity type opposite to said first conductivity type and wherein said second gate structure comprises a second gate insulation layer and a second work function adjustment metal layer over said second gate insulation layer;

wherein said first work function adjustment metal layer and said second work function adjustment metal layer comprise substantially the same metal.

2. The semiconductor structure of claim 1, wherein said first gate structure further comprises a semiconductor layer over said first work function adjustment metal layer, wherein said semiconductor layer is doped to have said first conductivity type.

3. The semiconductor structure of claim 2, wherein said varactor further comprises a first highly doped semiconductor region and a second highly doped semiconductor region adjacent said body region, wherein said first and said second highly doped semiconductor regions are doped to have said first conductivity type and have a higher dopant concentration than said body region.

4. The semiconductor structure of claim 3, wherein said first highly doped semiconductor region and said second highly doped semiconductor region are contiguous with said body region directly below a sidewall of said first gate structure.

5. The semiconductor structure of claim 4, wherein said first conductivity type is an N-type conductivity and said second conductivity type is a P-type conductivity.

6. The semiconductor structure of claim 5, wherein said body region comprises silicon germanium.

7. The semiconductor structure of claim 5, wherein each of said first work function adjustment metal and said second work function adjustment metal comprises at least one of aluminum and titanium nitride.

8. The semiconductor structure of claim 4, wherein said first conductivity type is a P-type conductivity and said second conductivity type is an N-type conductivity.

9. The semiconductor structure of claim 8, wherein each of said first work function adjustment metal and said second work function adjustment metal comprises at least one of lanthanum, lanthanum nitride and titanium nitride.

10. A varactor, comprising:
a body region comprising an N-doped semiconductor material;
a gate structure formed over said body region, said gate structure comprising a gate insulation layer and a work function adjustment metal layer over said gate insulation layer;
wherein said semiconductor material has an electron affinity and a bandgap;
wherein said work function adjustment metal layer comprises a metal having a work function; and
wherein an absolute value of a difference between said work function of said metal and a sum of said electron affinity and said bandgap of said semiconductor material is smaller than an absolute value of an energy difference between said work function of said metal and said electron affinity of said semiconductor material.

11. The varactor of claim 10, wherein said semiconductor material comprises silicon and said work function of said metal is in a range from about 5.3 eV to about 4.7 eV.

12. The varactor of claim 10, wherein said semiconductor material comprises at least one of silicon and silicon germanium and said metal comprises at least one of aluminum and titanium nitride.

13. A varactor, comprising:
a body region comprising a P-doped semiconductor material;
a gate structure formed over said body region, said gate structure comprising a gate insulation layer and a work function adjustment metal layer over said gate insulation layer;
wherein said semiconductor material has an electron affinity and a bandgap;
wherein said work function adjustment metal layer comprises a metal having a work function; and
wherein an absolute value of a difference between said work function of said metal and said electron affinity of said semiconductor material is smaller than an absolute value of a difference between said work function of said metal and a sum of said electron affinity and said bandgap of said semiconductor material.

14. The varactor of claim 13, wherein said semiconductor material comprises silicon and said work function of said metal is in a range from about 4.4 eV to about 3.8 eV.

15. The varactor of claim 13, wherein said semiconductor material comprises at least one of silicon and silicon germanium and said metal comprises at least one of lanthanum, lanthanum nitride and titanium nitride.

16. A device, comprising:
a body region comprising a silicon germanium layer, wherein said silicon germanium layer in said body region is doped to have a first conductivity type;
a gate insulation layer over said body region;
a gate electrode over said gate insulation layer, said gate electrode comprising a conductive work function metal layer over said gate insulation layer and a conductive material formed above said conductive work function metal layer; and
first and second highly doped semiconductor regions adjacent said body region, wherein said first and said second highly doped semiconductor regions are doped to have said first conductivity type and have a higher dopant concentration than said body region, said first and second highly doped semiconductor regions each have a first portion immediately adjacent said gate electrode and a second portion adjacent said first portion and having a first depth greater than a second depth of a lowermost portion of said first portion, and a third depth of said silicon germanium is greater than said second depth, and wherein said body region, said gate insulation layer, said gate electrode, and said first and second highly doped semiconductor regions define a varactor.

17. The device of claim 16, wherein said gate insulation layer comprises a high-k material having a greater dielectric constant than silicon and said gate electrode comprises a metal.

18. The device of claim 16, wherein a depth of said first and second highly doped semiconductor regions is greater than a depth of said silicon germanium layer in said body region.

19. The device of claim 18, wherein said gate insulation layer and said gate electrode define a first gate structure, and said first highly doped semiconductor region and said second highly doped semiconductor region are contiguous with said body region directly below a sidewall of said first gate structure.

20. The device of claim 16, wherein said first conductivity type comprises an N-type conductivity type.

21. The device of claim 16, wherein said conductive material comprises a semiconductor material.

* * * * *